United States Patent [19]

Howe et al.

[11] 4,190,701
[45] Feb. 26, 1980

[54] V$_3$GA COMPOSITE SUPERCONDUCTOR

[75] Inventors: David G. Howe, Greenbelt, Md.; Donald U. Gubser, Fairfax, Va.

[73] Assignee: The United States of America as represented by the Secretary of the Navy, Washington, D.C.

[21] Appl. No.: 27,691

[22] Filed: Apr. 6, 1979

[51] Int. Cl.$^2$ .................. H01L 39/00; H01B 12/00; H01V 11/00

[52] U.S. Cl. ..................... 428/662; 29/599; 75/134 V; 148/11.5 Q; 148/127; 148/133; 428/930

[58] Field of Search .............. 428/930, 662; 148/11.5 Q, 127, 133; 75/134 V; 29/599

[56] References Cited

U.S. PATENT DOCUMENTS

| | | | |
|---|---|---|---|
| 3,574,573 | 4/1971 | Tachikawa et al. | 29/198 |
| 3,679,401 | 7/1972 | Müller et al. | 75/134 V |
| 3,811,185 | 5/1974 | Howe et al. | 29/599 |
| 3,857,173 | 12/1974 | Tachikawa | 29/599 |
| 3,874,074 | 4/1975 | Meyer | 29/599 |
| 3,910,802 | 10/1975 | Wong | 148/32 |
| 3,926,684 | 12/1975 | Howe | 148/11.5 R |
| 3,996,662 | 12/1976 | Hauck et al. | 29/599 |
| 4,002,504 | 1/1977 | Howe | 148/11.5 R |
| 4,094,059 | 6/1978 | Tachikawa et al. | 29/599 |
| 4,153,986 | 5/1979 | Tachikawa et al. | 29/599 |

FOREIGN PATENT DOCUMENTS

| | | | |
|---|---|---|---|
| 258601 | 4/1970 | U.S.S.R. | 75/134 V |
| 494424 | 11/1975 | U.S.S.R. | 75/134 V |

Primary Examiner—L. Dewayne Rutledge
Assistant Examiner—Upendra Roy
Attorney, Agent, or Firm—R. S. Sciascia; Philip Schneider; Thomas E. McDonnell

[57] ABSTRACT

A composite superconductor which comprises:
(1) A matrix sheath of a copper-base alloy containing from about 12 to about 20 at. % of gallium and from about 0.2 to about 6 at. % of aluminum;
(2) a core in said matrix sheath, said core being of a vanadium-base alloy containing from about 1.0 to about 9.5 at. % of gallium and from about 0.1 to about 2.5 at. % of titanium; and
(3) a continuous interfacial layer of V$_3$Ga between said matrix sheath and said core.

14 Claims, 4 Drawing Figures

U.S. Patent  Feb. 26, 1980  Sheet 1 of 2  4,190,701
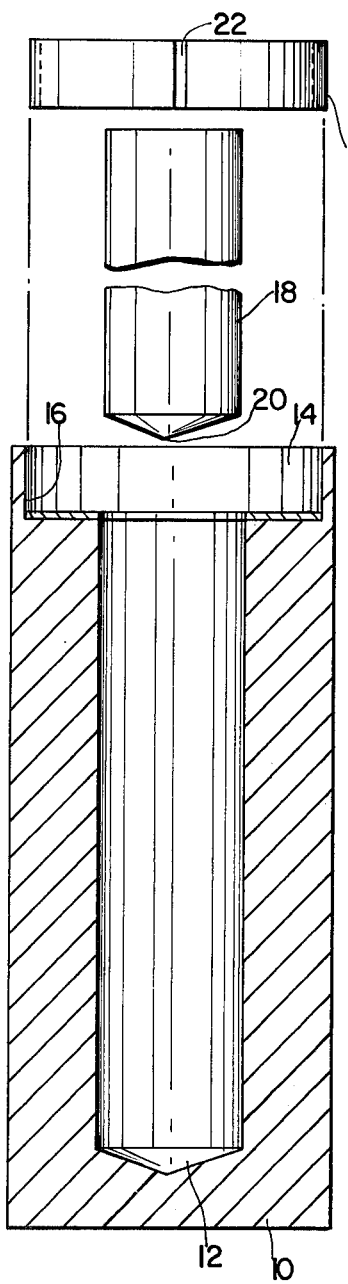
FIG. 1
FIG. 3
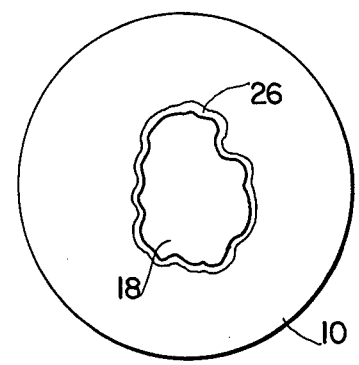
FIG. 2
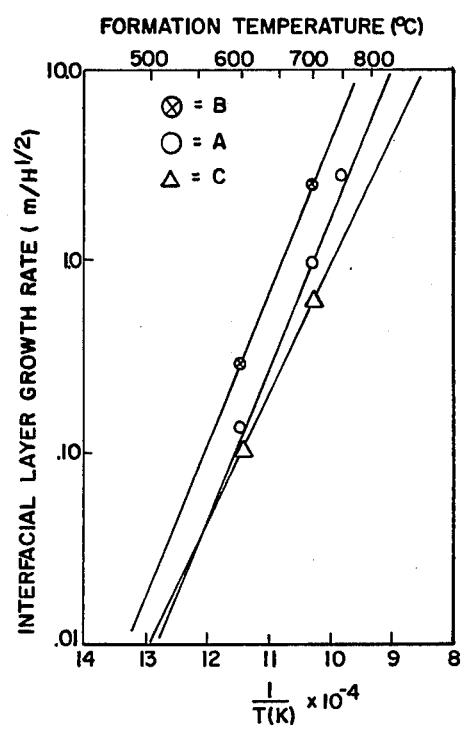

V₃GA COMPOSITE SUPERCONDUCTOR

BACKGROUND OF THE INVENTION

This invention relates generally to superconductors and in particular to superconductors resulting from a solid-state reaction between two alloys.

Superconductors are usually compared in terms of critical current densities, $J_c$, and the critical temperature, $T_c$. Critical current density values indicate the ability of the material to carry large currents. Values are obtained by dividing the critical current by the cross-sectional area. The critical current is defined as the maximum current passed through a conductor in a transverse magnetic field before a measurable voltage (microvolt/cm.) appears in the conductor.

The critical temperature, $T_c$ is the temperature at which a material achieves the superconducting property. Since the transition from "normal" to superconducting occurs over a temperature range, values for this parameter have been variously reported at the onset of superconductivity or at the midpoint of the temperature range. For the purposes of this application the critical temperature is the midpoint of the range and hence would be lower than the values reported by the other manner.

Intermetallic compounds having an A-15 crystal structure are known to be exceptional superconducting materials. This structure is also referred to as the beta-tungsten crystalline structure. One of the ways in which these compounds are obtained is by a solid-state reaction between two alloys in a vacuum or inert atmosphere at an elevated temperature.

An excellent example of this type of superconductor is the composite of V-9 at.%Ga/V₃Ga/Cu-17.5 at.-%Ga. The critical current density, $J_3$ has been measured to be $10.1 \times 10^6$ amps/cm.² at 4.2° K. and 10 tesla for a composite prepared with V₃Ga-reaction temperature of 550° C. and a processing time of 400 hours. If the V₃Ga reaction temperature is increased to 700° C., the processing time is reduced to four hours but the critical-current density is reduced to $1.5 \times 10^5$ amps/cm.² at 4° K. and 10 tesla.

One reason why this V₃Ga composite superconductor has exceptional $J_c$ values is the fine grain size of the V₃Ga layer. Since the primary flux-pinning sites in an A-15 compound are the grain boundaries of the compound, reducing the grain size increases the critical current density. Factors affecting the grain size are the formation temperature, the amount of the alloying reactant element, e.g., gallium, and the addition of one or more alloying elements.

Unfortunately, the first two factors have disadvantages and the third is largely unknown. A reduced reaction temperature produces a fine grain size but also causes the reaction time to increase to many days as is shown by the above data for the V₃Ga superconductor. Increasing the alloying reactant accelerates the reaction and decreases the grain size, but also increases the cost of the superconductor due to the high cost of the element and increases brittleness of the composite. This consideration is especially important for V₃Ga superconductors, which have gallium for the alloying reactant element.

Improvement in the grain size is not the only research objective. Other objectives include increasing the mechanical strength and ductility of superconductors. In addition to the effect that the reaction time and temperature have on grain size, these parameters are also important from economic considerations.

SUMMARY OF THE INVENTION

It is, therefore, an object of the present invention to increase the critical-current density in V₃Ga superconductors.

Another object of the present invention is decrease the reaction time required for producing a V₃Ga layer in a composite superconductor.

A further object of the present invention is to decrease the reaction temperature needed to obtain a certain reaction time for the production of a given V₃Ga layer in a composite superconductor.

A still further object is to prepare V₃Ga superconductors from alloys with a reduced gallium content without a loss in properties.

And yet another object of this invention is to prepare V₃Ga superconductors with increased mechanical strength and ductility.

These and other objects are achieved by preparing a V₃Ga superconductor from two ternary alloys, one being a copper-base alloy with gallium and a third metallic element, aluminum, which permits a reduction in the gallium content and acts as a growth catalyst and grain refiner and the other being a vanadium-base alloy with gallium and a third metallic element, titanium, which acts as a grain refiner and permits a reduction in gallium content.

BRIEF DESCRIPTION OF THE DRAWINGS

FIG. 1 is a cross-sectional view of an unassembled matrix rod, core rod, and end plug utilized in the fabrication of superconductors of this invention.

FIG. 2 is an axial cross-sectional view of a superconductor of this invention.

FIG. 3 is a graph showing the V₃Ga-interfacial-layer growth rate as a function of temperature.

DETAILED DESCRIPTION OF THE INVENTION

Figure 4:
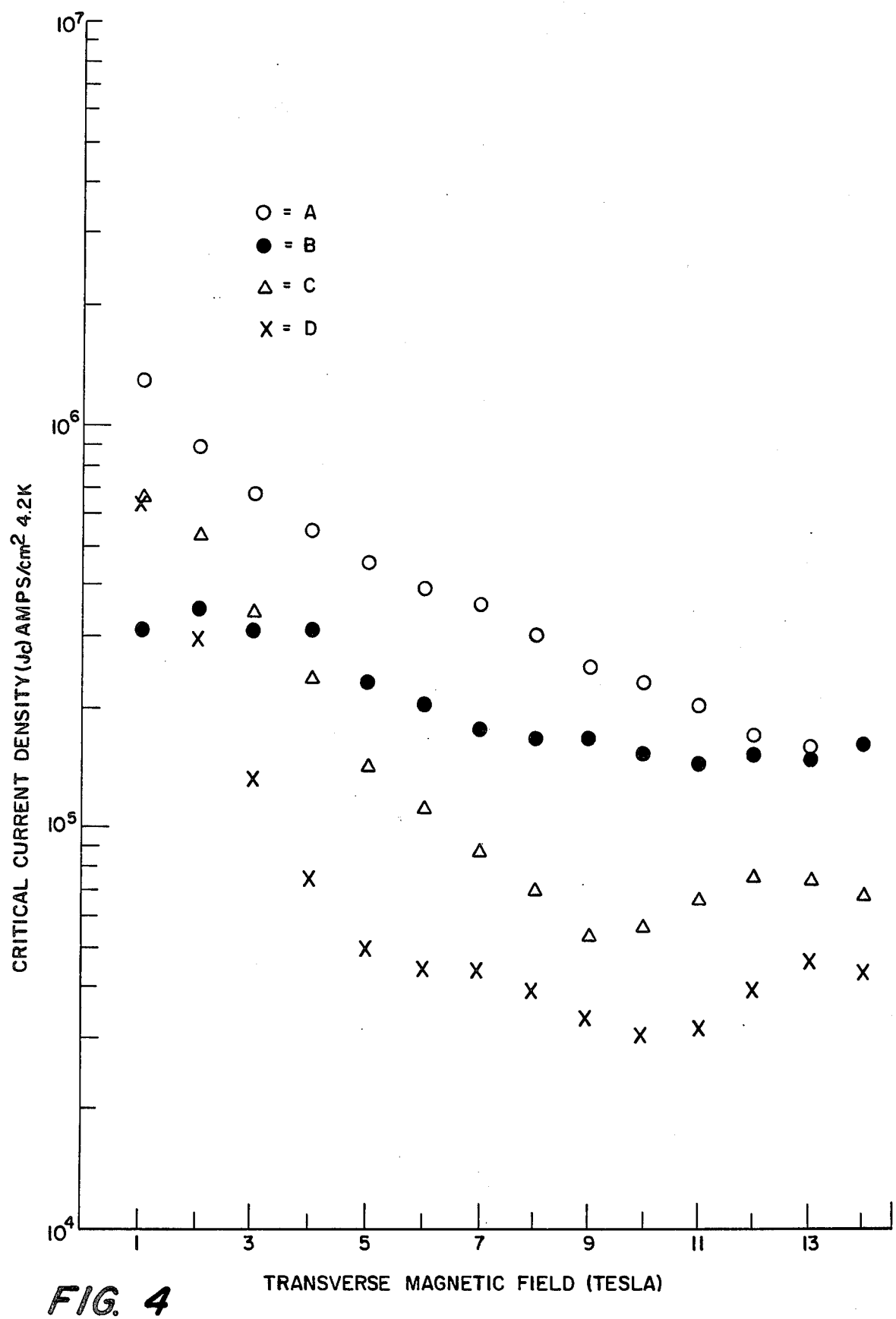
FIG. 4 is a graph showing the variation of the critical current density over the transverse magnetic field range of 0–13.5 Tesla.

The ternary alloy of the matrix is a copper-base alloy having from about 12 to about 20 atomic percent of gallium and from about 0.2 to about 6 atomic percent of aluminum. Preferably, the alloy has from 14 to 18 atomic percent of gallium and from 0.5 to 4 atomic percent of aluminum. Most preferably, the alloy has from 16.5 to 17.5 atomic percent of gallium and from 0.5 to 2 atomic percent of aluminum. It is important that the total of the alloying metallic elements does not exceed about 20.2 atomic percent and preferably 20.0 atomic percent. If the total exceeds about 20.2 atomic percent, the probability of developing a second phase is greatly increased. The presence of a second phase increases the brittleness of the alloy, which causes considerable problems in metallurgical processing, e.g., swaging or drawing.

The core is prepared from a vanadium-base ternary alloy having from about 1 to 9.5 atomic percent of gallium and from about 0.1 to about 2.5 atomic percent of titanium. Preferably, the alloy has from 6 to 8.6 atomic percent of gallium and from 0.2 to 1.0 atomic percent of titanium. Most preferably, the alloy has from 7.0 to 8.3 atomic percent of gallium and from 0.2 to 0.6 atomic percent of titanium. To avoid the development of a second phase in the alloy, the total of the alloying metallic elements should not exceed about 9.6 atomic percent and preferably should not exceed 8.5 atomic percent. If the end product requires little processing, e.g., an electrical switch, a second phase can be tolerated.

Manufacture of a composite superconductor proceeds in four stages: pre-assembly, assembly, metallurgical processing and final growth of the beta-tungsten crystalline structure through a solid-state reaction. It is preferred that the pre-assembly processing for superconductors of this invention be done in accordance with the method in U.S. Pat. No. 3,926,684 issued on Dec. 16, 1975 to David G. Howe. The preferred method of processing for the last three stages is the method in U.S. Pat. No. 4,002,504 issued on Jan. 11, 1977 to David G. Howe.

FIG. 1 shows, prior to assembly, the components of composite assembly which is machined and reacted to form the composite superconductors which were tested to demonstrate the improvements realized by the practice of the present invention.

Essentially the composite assembly comprises a matrix rod 10, core rod 18, and end plug 22. The matrix rod has a cavity 12 which may or may not be tapered and a recess 14 at the open end of the matrix rod 10. If the work piece is not assembled in a vacuum, small ridge 16 must be located at the bottom of recess 14 so that end plug 22 does not rest on the assembled core or the bottom of recess 14. This air space allows the cavity to be completely evacuated after assembly; so, an air space depth of 0.005 inches (0.013 cm) is sufficient.

The filament 18 should be slightly shorter than the length of the cavity. Since the purpose of the difference in lengths is to ensure an easy and complete evacuation of the cavity, the difference need only be 0.005 inches (0.013 cm). The end 20 of the core is preferably notched and/or tapered.

It is preferred that the end plug extends about a quarter of an inch (0.0064 cm) beyond the matrix rod, thereby allowing the composite assembly to be sealed by, e.g., melting the excess through electron-beam welding. In order to improve outgassing, end plug 22 has a plurality of channels 24 on its circumference. The size of the channels is such that the bore in the matrix rod can be completely evacuated after the composite is assembled. Of course, if the composite assembly is assembled in a vacuum, the channels in the end plug would not be necessary.

There is a slight modification in the solid-state reaction stage of the superconductor processing. Since the composition of the superconductor is different, the temperature range of the solid-state reaction is also different. The solid-state reaction can be practically carried out from about 450 to about 750° C. Below 450° C., the reaction either does not proceed or proceeds very slowly. Above 750° C., the grain size is so large that the quality of the superconductor is too low for a practical superconductor. The preferred temperature range is from 480 to 600° C.

The reaction can last until the $V_3Ga$ layer is from about 0.1 to about 15 microns in thickness. A layer less than 0.1 microns is too thin to carry an acceptable amount of current and a layer greater than 15 microns could develop micro-cracks which would limit the current the conductor could carry. The micro-cracks develop on account of thermal stresses which develop during cooling. The preferred thickness is from 0.1 to 4 microns and the most preferred is from 0.1 to 2.5 microns.

Superconductors made in accordance with this invention can be fabricated into many constructions. Examples of possible constructions are mono-or multifilament wire or tape or a sandwich solid-state switch. To demonstrate the improvement provided by the present invention, four superconducting wires were prepared for comparison of their growth rate as a function of temperature and of their critical current density as a function of the strength of a transverse magnetic field. Table I summarizes the composition of these superconductors.

Table I

| Superconductors | Core Alloy, at. % | Matrix Alloy, at. % |
|---|---|---|
| A | V-8Ga-0.5Ti | Cu-14Ga-4Al |
| B | V-9Ga | Cu-17.5Ga |
| C | V-6.5Ga | Cu-15.4Ga |
| D | V | Cu-15.4Ga |

These superconductors were prepared as follows: Rods of the listed alloys were prepared from high-purity metals (99.999% Cu, 99.9%V, 99.99%Ga, 99.9999%Al, and 99.999% Ti). The core alloys were arc-melted in helium and cast as one-half inch (1.27 cm) diameter rods. After a homogenization anneal in an evacuated silica ampoule at about 1000° C. for about 64 hours for composite-A core alloy and at about 1100° C. for about 60 hours for composite-B-D core alloys, the rods were removed from the furnace and allowed to cool in the silica ampoule to room temperature. The cooling lasted about 1½ hours. The rods were reduced 30% in diameter by swaging, followed by an intermediate anneal at 800° C. for one hour. The core rods from composite-A alloy were further reduced to three-sixteenth inch diameter (0.48 cm) by swaging and the rods from composite-B-to-D alloys were reduced to one-quarter inch diameter (0.64 cm) by swaging. A final anneal at 800° C. for 16 hours was given to the core rods.

The matrix alloys were induction-melted and cast into 1¼ inch (3.18 cm) diameter rods. After surface-machining the rods to a 1⅛ inch (2.86 cm) diameter with a metal lathe, the matrix rods were annealed at 700° C. for 16 hours. Next the rods were reduced 20% in diameter and were annealed at 500° C. for 1 hour. Rods made from matrix composite-A alloy were reduced by swaging to ⅜ inch diameter (0.95 cm) rods, whereas rods made from matrix composite-B-to-D alloys were reduced by swaging to ½ inch (1.27 cm) rods. All four matrix alloys were then annealed at 500° C. for one hour.

The matrix rods were cut to a 4.5 inch (11.43 cm) length and a single hole was machined to within ½ inch (1.27 cm) of the end and to a diameter that was 0.004 inches (0.01 cm) larger than the core rod. Following a final cleaning by chemical etching of the rods, the core rods with a length of 3.5 inches (8.89 cm) were inserted into the respective matrix, matrix rods were capped with a grooved end plug made from the matrix material. The composite assemblies were evacuated to a pressure of $1 \times 10^{-5}$ Torr and sealed with an electron-beam weld.

The assemblies were reduced by several series of swagings and anneals to 0.086 inches (2.2 mm). The series consisted of three 20 percent reductions in diameter followed by an annealing. After each of the first two swagings, the rods were annealed at 500° C. for one hour and after the third swaging the rods were annealed at 550° C. for one hour. Next the rods were reduced to 0.032 inch (0.81 mm) diameter composite wires by wire-drawing. Like swaging, the reductions by wire-drawing proceeded in a series of 20 percent reductions in diameter and subsequent intermediate anneals. The temperatures and sequence were the same.

Wires of composite A, B, C, and D were reacted at the temperatures shown in FIG. 1. Wires A and C have nearly the same gallium content, but composite wire A has a significantly better growth rate at higher reaction temperatures. Above 700° C., the growth rate for composite A is about half way between composite C and the high-gallium-content composite B.

Additional wires were reacted at 700° C. until the thickness shown in Table II were obtained.

TABLE II

| Superconductor | $V_3Ga$ Thickness | Growth Times (Hrs) |
|---|---|---|
| A | 3.0μm | 16 |
| B | 3.6μm | 4 |
| C | 4.0μm | 44 |
| D | 3.4μm | 47 |

The wires shown in Table II were placed in a transverse magnetic field and the strength of the field was varied. After each change, the critical current was measured by the four-point probe technique at 4.2K. The critical-current densities of composite wire A had exceptional values. As FIG. 2 shows composite wire A had $J_c$ values in excess of or equal to the gallium-rich composite B in the important magnetic field intensities from 9 to 13 Tesla.

Other significant features of composite wire A were its critical temperature, strength and ductility. The metallurgical processing behavior of this wire was about the same as exhibited in the lower-gallium-content wires C and D. The critical temperature of 14.7° K. was comparable to the high-gallium-content wire B which had a critical temperature of 14.9° K.

It is evident from the above data that a superconductor of a quality comparable to a high-gallium-content binary composite is possible. Since the gallium content is reduced, the cost and processing is improved with the exception of a longer solid-state reaction time. If the gallium content is increased, the quality and reaction time should be much better than those of the best binary $V_3Ga$ composites.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A composite supreconductor which comprises;
    a core of an alloy consisting of a vanadium-base ternary alloy having from about 1 to 9.5 atomic percent of gallium, and from about 0.1 to about 2.5 atomic percent of titanium, the remainder being vanadium;
    a matrix of an alloy consisting of about 12 to about 20 atomic percent of gallium and about 0.2 to about 6 atomic percent of aluminum, the remainder being copper; and
    an interfacial layer of $V_3Ga$.

2. The composite superconductor of claim 1 wherein said alloy of said core consists of 6 to 8.6 atomic percent of gallium and 0.2 to 1.0 atomic percent of titanium, the remainder being vanadium, and said alloy of said matrix sheath consists of 14 to 18 atomic percent of gallium and from 0.5 to 4 atomic percent of aluminum, the remainder being copper.

3. The composite superconductor of claim 1 wherein said alloy of said core consists of 7.0 to 8.3 atomic percent of gallium and from 0.2 to 0.6 atomic percent of titanium, the remainder being vanadium; and said alloy of said matrix sheath consists of 0.5 to 2 atomic percent of aluminum, the remainder being copper.

4. The superconductor of claim 2 wherein said core comprises multiple units embedded individually in said matrix.

5. The superconductor of claim 4 wherein said multiple units are filaments and said superconductor is wire-shaped.

6. The superconductor of claim 3 wherein said core comprises multiple units embedded individually in said matrix.

7. The superconductor of claim 6 wherein said multiple units are filaments and said superconductor is wire-shaped.

8. The superconductor of claim 6 wherein said superconductor is tape-shaped.

9. The superconductor of claim 2 wherein said interfacial layer is from 0.1–15.0 microns in thickness.

10. The superconductor of claim 3 wherein said interfacial layer is from 0.1 to 15.0 microns in thickness.

11. The superconductor of claim 7 wherein said interfacial layer is from 0.1 to 4.0 microns in thickness.

12. The superconductor of claim 11 wherein said interfacial layer is from 0.1 to 2.5 microns in thickness.

13. The superconductor of claim 11 wherein said interfacial layer was grown at a temperature from about 480° to 600° C.

14. The superconductor of claim 12 wherein said interfacial layer was grown at a temperature from 480° to 600° C.

* * * * *